(12) United States Patent
Yu et al.

(10) Patent No.: US 10,672,912 B2
(45) Date of Patent: Jun. 2, 2020

(54) N-TYPE THIN FILM TRANSISTOR, MANUFACTURING METHOD THEREOF AND MANUFACTURING METHOD OF AN OLED DISPLAY PANEL

(71) Applicant: Wuhan China Star Optoelectronics Semiconductor Display Technology Co., Ltd., Wuhan, Hubei (CN)

(72) Inventors: Lei Yu, Hubei (CN); Songshan Li, Hubei (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 15/740,595

(22) PCT Filed: Nov. 2, 2017

(86) PCT No.: PCT/CN2017/109118
§ 371 (c)(1),
(2) Date: Aug. 30, 2018

(87) PCT Pub. No.: WO2019/071670
PCT Pub. Date: Apr. 18, 2019

(65) Prior Publication Data
US 2019/0109240 A1    Apr. 11, 2019

(30) Foreign Application Priority Data
Oct. 10, 2017  (CN) .......................... 201710936407.9

(51) Int. Cl.
*H01L 29/786* (2006.01)
*H01L 29/49* (2006.01)
(Continued)

(52) U.S. Cl.
CPC .... *H01L 29/78609* (2013.01); *H01L 21/0217* (2013.01); *H01L 21/02164* (2013.01);
(Continued)

(58) Field of Classification Search
CPC .......... H01L 29/78609; H01L 27/3248; H01L 29/66598; H01L 29/42384; H01L 27/3262;
(Continued)

(56) References Cited

U.S. PATENT DOCUMENTS 6,909,114 B1 * 6/2005 Yamazaki ......... H01L 21/28114
257/344
8,896,046 B2 * 11/2014 Kato .................... H01L 27/0688
257/298
(Continued)

FOREIGN PATENT DOCUMENTS

CN          1564313 A       1/2005
CN         106098628 A      11/2016

*Primary Examiner* — Su C Kim
(74) *Attorney, Agent, or Firm* — Hemisphere Law, PLLC; Zhigang Ma

(57) ABSTRACT

The disclosure provides an N-type thin film transistor, including a poly-silicon layer, a gate layer, a source and a drain. The poly-silicon layer includes a channel region, a source region and a drain region at two side of the channel region. The gate layer is on the channel region, a projection of the gate layer on the poly-silicon layer partially overlaps the source region and the drain region, and a thickness of the gate layer on the source region and the drain region are smaller than a thickness of the gate layer on the channel region. The source region and the drain region both include a heavily-doping region and a lightly-doping region connected to the heavily-doping region, the source and the drain are respectively on the heavily-doping region of the source region and the drain, and respectively electrically connects
(Continued)

to the heavily-doping region of the source region and the drain.

15 Claims, 5 Drawing Sheets

(51) Int. Cl.
| | |
|---|---|
| *H01L 29/66* | (2006.01) |
| *H01L 21/265* | (2006.01) |
| *H01L 21/266* | (2006.01) |
| *H01L 21/02* | (2006.01) |
| *H01L 21/28* | (2006.01) |
| *H01L 27/12* | (2006.01) |
| *H01L 51/56* | (2006.01) |
| *H01L 27/32* | (2006.01) |
| *H01L 29/423* | (2006.01) |

(52) U.S. Cl.
CPC .. *H01L 21/02274* (2013.01); *H01L 21/02532* (2013.01); *H01L 21/02592* (2013.01); *H01L 21/02675* (2013.01); *H01L 21/266* (2013.01); *H01L 21/26513* (2013.01); *H01L 21/28079* (2013.01); *H01L 21/28158* (2013.01); *H01L 27/1222* (2013.01); *H01L 27/1274* (2013.01); *H01L 27/1288* (2013.01); *H01L 27/3246* (2013.01); *H01L 27/3248* (2013.01); *H01L 27/3258* (2013.01); *H01L 27/3262* (2013.01); *H01L 29/42384* (2013.01); *H01L 29/4908* (2013.01); *H01L 29/66492* (2013.01); *H01L 29/66598* (2013.01); *H01L 29/66757* (2013.01); *H01L 29/78621* (2013.01); *H01L 29/78675* (2013.01); *H01L 51/56* (2013.01); *H01L 2227/323* (2013.01); *H01L 2251/308* (2013.01)

(58) Field of Classification Search
CPC . H01L 27/2358; H01L 27/3246; H01L 51/56; H01L 27/1274; H01L 27/1288; H01L 27/1222; H01L 21/28158; H01L 21/28079; H01L 21/02274; H01L 21/0217; H01L 21/02164; H01L 21/02675; H01L 21/02532; H01L 21/02592; H01L 21/266; H01L 21/26513; H01L 29/66757; H01L 29/66492; H01L 29/78675; H01L 29/78621; H01L 29/4908; H01L 2251/308; H01L 2227/323
See application file for complete search history.

(56) References Cited

U.S. PATENT DOCUMENTS

| | | | |
|---|---|---|---|
| 9,640,569 B2 * | 5/2017 | Xue | H01L 29/66598 |
| 2016/0329356 A1 * | 11/2016 | Chan | H01L 27/1248 |

\* cited by examiner

N-TYPE THIN FILM TRANSISTOR, MANUFACTURING METHOD THEREOF AND MANUFACTURING METHOD OF AN OLED DISPLAY PANEL

RELATED APPLICATIONS

The present application is a National Phase of International Application Number PCT/CN2017/109118, filed Nov. 2, 2017, and claims the priority of China Application No. 201710936407.9, filed Oct. 10, 2017.

FIELD OF THE DISCLOSURE

The disclosure relates to a display technical field, and more particularly to an N-type thin film transistor, a manufacturing method thereof and a manufacturing method of an OLED display panel.

BACKGROUND

The conventional method for manufacturing low-temperature polysilicon N-type thin film transistor is to form N+ region (i.e. heavily-doping region) and N− region (N− region is also called LDD: light drain doping) after crystallizing and patterning the polysilicon. The conventional method needs to define the N+ region and N− region respectively by using two masks, and implant the phosphorus ions twice. Then, a gate insulating layer is deposited by plasma enhanced chemical vapor deposition. The conventional method for manufacturing a low-temperature polysilicon N-type thin film transistor has a complicated process flow and high fabrication cost, and the thickness of the gate layer in the N-type thin film transistor manufactured by the conventional method is uniform and a large leakage current occurs when the thin film transistor is in the off state causes the thin film transistor to be not very sensitive to the turn-off and turn-on, the display effect of the display panel will be affected.

SUMMARY

A technical problem to be solved by the disclosure is to provide an N-type thin film transistor, a manufacturing method thereof and a manufacturing method of an OLED display panel to reduce the leakage current of the thin film transistor, so the property of the thin film transistor could be improved.

To achieve the above object, according to one aspect, the embodiment of the disclosure provides an N-type thin film transistor, from bottom to top, including a poly-silicon layer, a gate layer, a source, and a drain;
wherein the poly-silicon layer includes a channel region, a source region and a drain region are located at two side of the channel region, the gate layer is disposed on the channel region, a projection of the gate layer on the poly-silicon layer partially overlaps the source region and the drain region, and a thickness of the gate layer on the source region and a thickness of the drain region are both smaller than a thickness of the gate layer on the channel region;
wherein the source region and the drain region both include a heavily-doping region and a lightly-doping region connected to the heavily-doping region, the lightly-doping regions are disposed under the gate layer, the source is disposed on the heavily-doping region of the source region and electrically connects to the heavily-doping region of the source region, and the drain is disposed on the heavily-doping region of the drain region and electrically connects to the heavily-doping region of the drain region.

In an embodiment, an ion of the heavily-doping region and an ion of the lightly-doping region both are phosphorus ions.

In an embodiment, the N-type thin film further includes a gate insulating layer disposed between the poly-silicon layer and the gate layer, and a dielectric layer disposed on the gate insulating layer, the dielectric layer covering the gate layer and including SiNx and/or SiOy, wherein x≥1, y≥1.

In an embodiment, two first connection holes are disposed on the dielectric layer, two second connection holes are disposed on the gate insulating layer, the two first connection holes respectively face the two second connection holes, and the two second connection holes respectively face the heavily-doping region of the source region and the heavily-doping region of the drain region;
wherein the source and the drain are disposed on the dielectric layer, the source electrically connects to the heavily-doping region of the source region via the first connection hole and the second connection hole, the drain electrically connects to the heavily-doping region of the drain region via the first connection hole and the second connection hole.

According to another aspect, the embodiment of the disclosure provides a manufacturing method of an N-type thin film transistor, including the following steps:
forming a poly-silicon layer on a substrate;
patterning the poly-silicon layer to form a channel region, a source region and a drain region located at two sides of the channel region;
forming a gate layer on the poly-silicon layer, the gate layer disposed on the channel region, a projection of the gate layer on the poly-silicon layer partially overlapping the source region and the drain region;
patterning the gate layer, a thickness of the gate layer on the source region and a thickness of the drain region both smaller than a thickness of the gate layer on the channel region;
performing an ion implantation to the source region and the drain region by using the gate layer as a mask to form two doping regions, each doping region including a heavily-doping region and a lightly-doping region connected to the heavily-doping region; and
forming a source and a drain on the two heavily-doping regions, the source and the drain respectively electrically connected to the two heavily-doping regions.

In an embodiment, the manufacturing method of an N-type thin film transistor further includes the following step before forming a gate layer on the poly-silicon layer:
forming a gate insulating layer on the poly-silicon layer, wherein the gate insulating layer is disposed between the poly-silicon layer and the gate layer.

In an embodiment, the manufacturing method of an N-type thin film transistor further includes the following step before forming a poly-silicon layer on a substrate:
forming a buffer layer on the substrate, wherein the buffer layer includes SiNx and/or SiOy, x≥1, y≥1.

In an embodiment, forming a poly-silicon layer on a substrate includes the following step:
depositing an amorphous silicon layer on the buffer layer; and
applying excimer laser crystallization to transform the amorphous silicon layer into the poly-silicon layer.

In an embodiment, patterning the gate layer includes the following step:

coating a photoresist on the gate layer;

exposing and developing the gate layer via a halftone mask to obtain a half-reserved photoresist portion, and the half-reserved photoresist portion disposed on the source and the drain; and partially etching an area of the gate layer located at the half-reserved photoresist portion.

In an embodiment, performing an ion implantation to the source region and the drain region includes:

applying an ion implantation technology to implant phosphorus ions into the source region and the drain region.

In an embodiment, forming a source and a drain on the two heavily-doping regions includes the following steps:

forming a dielectric layer on the gate insulating layer, and the dielectric layer covering the gate insulating layer;

patterning the dielectric layer and the gate insulating layer, forming two first connection holes on the dielectric layer, forming two second connection holes on the gate insulating layer, the two first connection holes respectively face the two second connection holes, and the two second connection holes respectively face the two heavily-doping regions;

depositing a metal layer on the dielectric layer, the metal layer electrically connected to the two heavily-doping regions via the two first connection holes and the two second connection holes; and patterning the metal layer to form the source and the drain.

In an embodiment, forming a dielectric layer on the gate insulating layer includes:

applying plasma-enhanced chemical vapor deposition to deposit SiNx and/or SiOy to form the dielectric layer.

In an embodiment, the manufacturing method of an N-type thin film transistor further includes the following step before patterning the dielectric layer and the gate insulating layer:

performing rapid thermal annealing to the dielectric layer, wherein a temperature of rapid thermal annealing ranges from 550° C. to 600° C. and a time of rapid thermal annealing ranges from 5 minutes to 15 minutes.

In an embodiment, depositing a metal layer on the dielectric layer includes:

applying physical vapor deposition to sequentially deposit molybdenum, aluminum, and molybdenum on the dielectric layer to form the metal layer.

According to another aspect, the embodiment of the disclosure provides a manufacturing method of an OLED display panel, including the following steps:

forming a poly-silicon layer on a substrate;

patterning the poly-silicon layer to form a channel region, a source region and a drain region located at two sides of the channel region;

forming a gate insulating layer on the poly-silicon layer;

forming a gate layer on the poly-silicon layer, the gate layer disposed on the channel region, a projection of the gate layer on the poly-silicon layer partially overlapping the source region and the drain region;

patterning the gate layer, a thickness of the gate layer on the source region and a thickness of the drain region both smaller than a thickness of the gate layer on the channel region;

performing an ion implantation to the source region and the drain region by using the gate layer as a mask to form two doping regions, each doping region including a heavily-doping region and a lightly-doping region connected to the heavily-doping region; and forming a source and a drain on the two heavily-doping regions, the source and the drain respectively electrically connected to the two heavily-doping regions;

wherein forming a source and a drain on the two heavily-doping regions comprises the following steps:

forming a dielectric layer on the gate insulating layer, and the dielectric layer covering the gate insulating layer;

wherein the manufacturing method of an OLED display panel further comprises:

forming a planarization layer on the dielectric layer, the planarization layer covering the source and the drain;

patterning the planarization layer to form a third connection hole on the planarization layer, the third connection hole disposed on the source or the drain;

forming an anode on the third connection hole, the anode electrically connected to the source or the drain;

depositing a pixel defining layer on the planarization layer, the pixel defining layer covering the anode;

patterning the pixel defining layer to form a fourth connection hole on the pixel defining layer, the fourth connection hole disposed on the anode; and depositing an organic light emitting material on the fourth connection hole, the organic emitting material in contact with the anode.

In an embodiment, forming an anode on the third connection hole includes:

depositing an indium tin oxide, and patterning the indium tin oxide to form the anode;

wherein a material of the planarization layer and a material of the pixel defining layer both include polyimide.

In an embodiment, the manufacturing method of an OLED display panel further includes the following steps before forming a poly-silicon layer on a substrate:

forming a buffer layer on the substrate, wherein the buffer layer includes SiNx and/or SiOy, x≥1, y≥1;

wherein forming a poly-silicon layer on a substrate comprises the following step:

depositing an amorphous silicon layer on the buffer layer;

applying excimer laser crystallization to transform the amorphous silicon layer into the poly-silicon layer;

wherein patterning the gate layer comprises the following step:

coating a photoresist on the gate layer;

exposing and developing the gate layer via a halftone mask to obtain a half-reserved photoresist portion, and the half-reserved photoresist portion disposed on the source and the drain;

partially etching an area of the gate layer located at the half-reserved photoresist portion; and wherein performing an ion implantation to the source region and the drain region includes:

applying an ion implantation technology to implant phosphorus ions into the source region and the drain region.

In an embodiment, forming a source and a drain on the two heavily-doping regions includes the following steps:

patterning the dielectric layer and the gate insulating layer, forming two first connection holes on the dielectric layer, forming two second connection holes on the gate insulating layer, the two first connection holes respectively face the two second connection holes, and the two second connection holes respectively face the two heavily-doping regions;

depositing a metal layer on the dielectric layer, the metal layer electrically connected to the two heavily-doping regions via the two first connection holes and the two second connection holes; and patterning the metal layer to form the source and the drain.

In an embodiment, forming a dielectric layer on the gate insulating layer includes:

applying plasma-enhanced chemical vapor deposition to deposit SiNx and/or SiOy to form the dielectric layer.

In an embodiment, the manufacturing method of an OLED display panel further includes the following step before patterning the dielectric layer and the gate insulating layer:

performing rapid thermal annealing to the dielectric layer, wherein a temperature of rapid thermal annealing ranges from 550° C. to 600° C. and a time of rapid thermal annealing ranges from 5 minutes to 15 minutes; and wherein depositing a metal layer on the dielectric layer includes:

applying physical vapor deposition to sequentially deposit molybdenum, aluminum, and molybdenum on the dielectric layer to form the metal layer.

By practice of the embodiments of the disclosure, the thickness of the gate layer on the lightly-doping region of the N-type thin film transistor is thinner, the intensity of electric field is weaker, the attracted electrons are less, the resistance is larger in order to reduce the leakage current of the thin film transistor, so the property of the thin film transistor could be improved.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
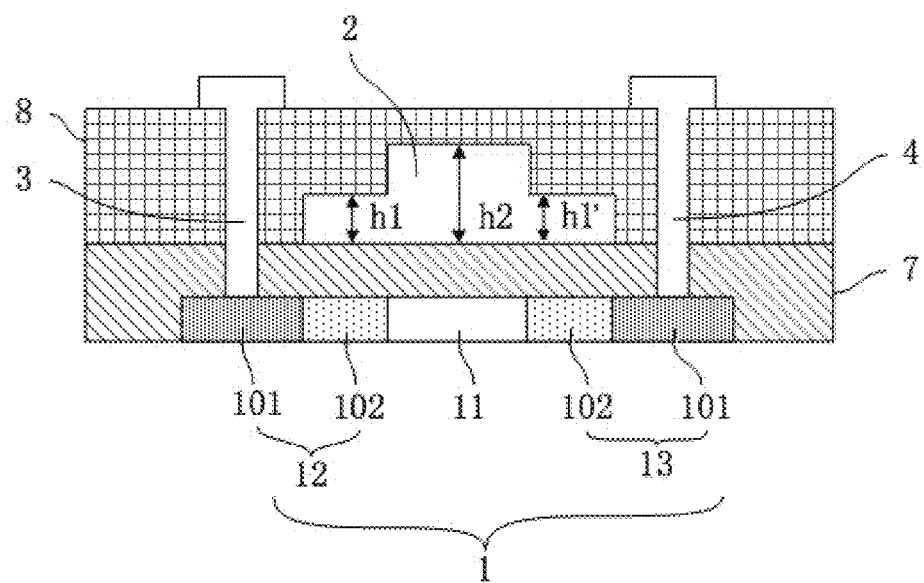
FIG. 1 is a structural schematic view of an N-type thin film transistor according to an embodiment of the disclosure.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

Referring to FIG. 1, an N-type thin film transistor provided by the embodiment from bottom to top includes a poly-silicon layer 1, a gate layer 2, a source 3, and a drain 4. N-type thin film transistor is the N channel thin film transistor. Wherein the poly-silicon layer 1 includes a channel region 11, a source region 12 and a drain region 13 are located at two side of the channel region 11, the gate layer 2 is disposed on the channel region 11, a projection of the gate layer 2 on the poly-silicon layer 1 partially overlaps the source region 12 and the drain region 12, and a thickness of the gate layer 2 on the source region 12 and a thickness of the drain region 13 are both smaller than a thickness of the gate layer 2 on the channel region 11. As shown in FIG. 1, the thickness h2 of the gate layer 2 on the channel region 11 is larger than the thickness h1 of the gate layer 2 on the source region 12 and the thickness h1' of the drain region 13, wherein the ratio of h1 to h2 and h1' to h2 both range about from 1/10 to 1/5, and h1 could be equal to h1'.

The source region 12 and the drain region 13 both include a heavily-doping region 101 and a lightly-doping region 102 connected to the heavily-doping region 101, the lightly-doping regions 102 are disposed under the gate layer 2, the source 3 is disposed on the heavily-doping region 101 of the source region 12 and electrically connects to the heavily-doping region 101 of the source region 12, and the drain 4 is disposed on the heavily-doping region 101 of the drain region 13 and electrically connects to the heavily-doping region 101 of the drain region 13.

Furthermore, an ion of the heavily-doping region 101 and an ion of the lightly-doping region 102 both are phosphorus ions. A gate insulating layer 7 is disposed between the poly-silicon layer 1 and the gate layer 2.

A dielectric layer 8 is disposed on the gate insulating layer 7, the dielectric layer 8 covering the gate layer 7 and includes SiNx and/or SiOy, wherein x≥1, y≥1.

Figure 2:
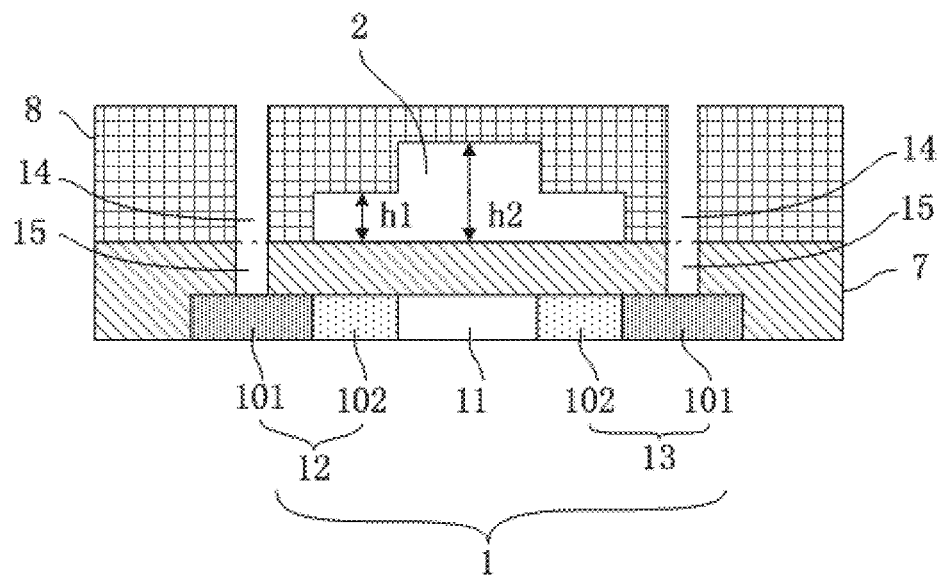
FIG. 2 is a schematic view of an N-type thin film transistor with marking first connection holes and second connection holes according to an embodiment of the disclosure.

Referring to FIG. 2, two first connection holes 14 are disposed on the dielectric layer 8, two second connection holes 15 are disposed on the gate insulating layer 7, the two first connection holes 14 respectively face the two second connection holes 15, and the two second connection holes 15 respectively face the heavily-doping region 101 of the source region 12 and the heavily-doping region 101 of the drain region 13.

The source 3 and the drain 4 are disposed on the dielectric layer 8, the source 3 electrically connects to the heavily-doping region 101 of the source region 12 via the first connection hole 14 and the second connection hole 15, the drain 4 electrically connects to the heavily-doping region 101 of the drain region 13 via the first connection hole 14 and the second connection hole 15.

Figure 3:
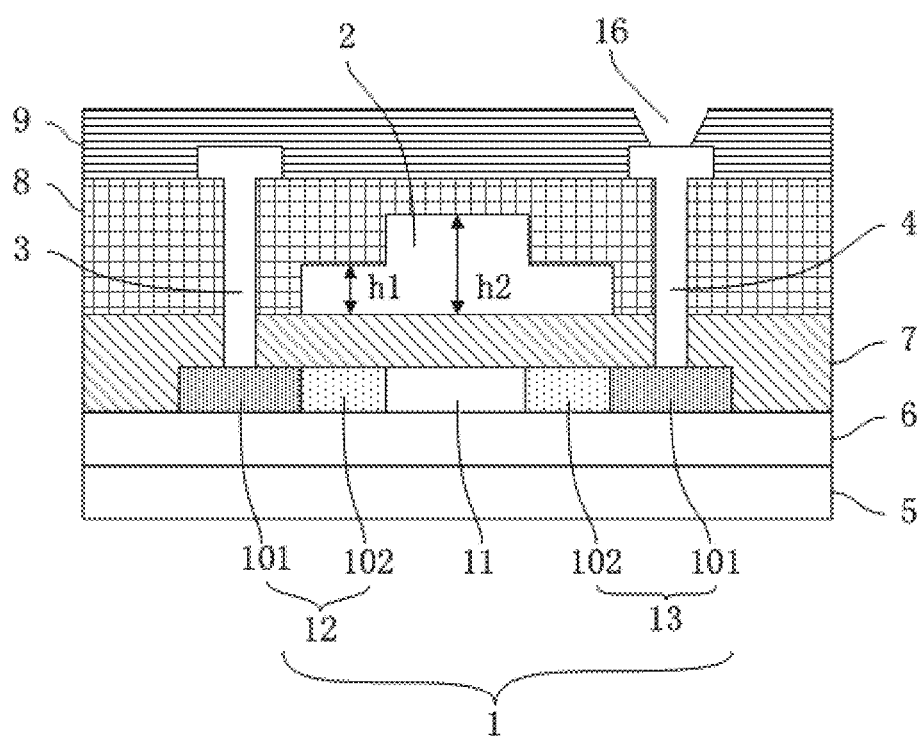
FIG. 3 is a schematic view of an OLED display panel with marking a third connection hole according to an embodiment of the disclosure.
Figure 4:
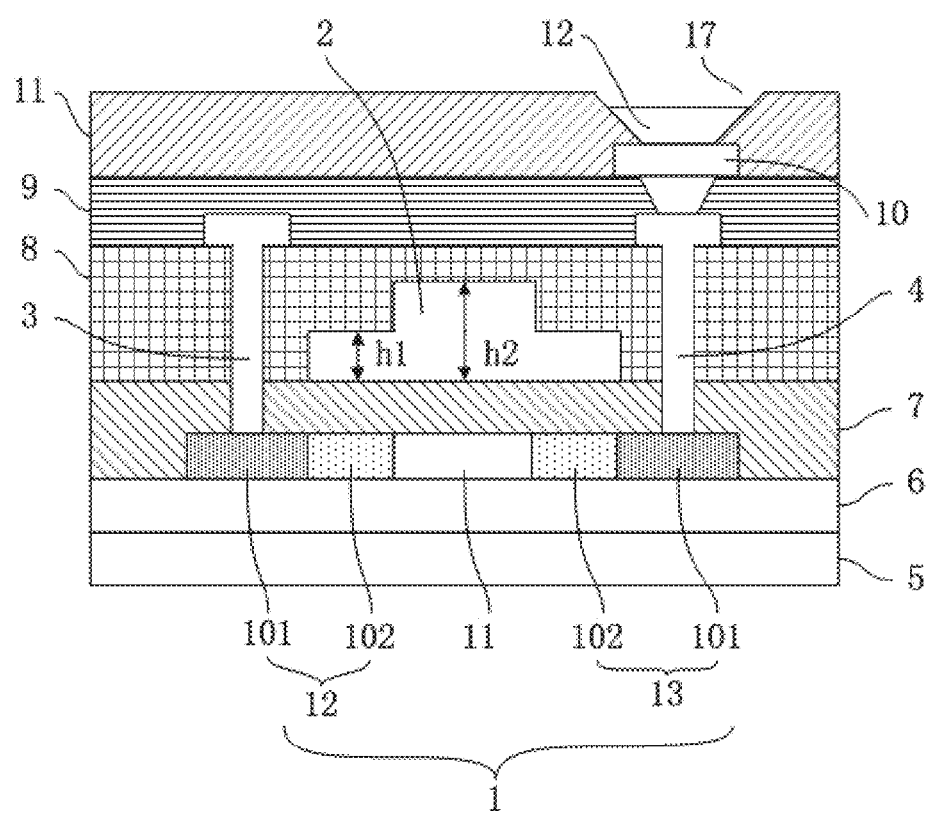
FIG. 4 is a structural schematic view of an OLED display panel according to an embodiment of the disclosure.

Referring to FIG. 3 and FIG. 4, an OLED display panel provided by the embodiment includes the above-mentioned N-type thin film transistor. A substrate 5 is disposed under the poly-silicon layer 1 of the N-type thin film transistor, a planarization layer 9 is disposed on the dielectric layer 8 of the N-type thin film transistor, the planarization layer 9 covers the source 3 and the drain 4 of the N-type thin film transistor. A third connection hole 16 is disposed on the planarization layer 9, and the third connection hole 16 is disposed on the source 3 or the drain 4 a third connection hole on the planarization layer, the third connection hole disposed on the source or the drain. An anode 10 is disposed on the third connection hole 16, and the anode 10 electrically connected to the source 3 or the drain 4. Wherein the substrate 5 may be a glass substrate.

A pixel defining layer 11 is disposed on the planarization layer 9, and a fourth connection hole 17 is disposed on the pixel defining layer 11, the fourth connection hole 17 is disposed on the anode 10. An organic light emitting material 12 is disposed on the fourth connection hole 17, and the organic emitting material 12 is in contact with the anode 10. Wherein the organic emitting material 12 may be OLED (organic light-emitting diode) material.

Moreover, a buffer layer 6 is disposed between the poly-silicon layer 1 and the substrate 5, wherein the buffer layer 5 includes SiNx and/or SiOy, x≥1, y≥1.

Figure 5:
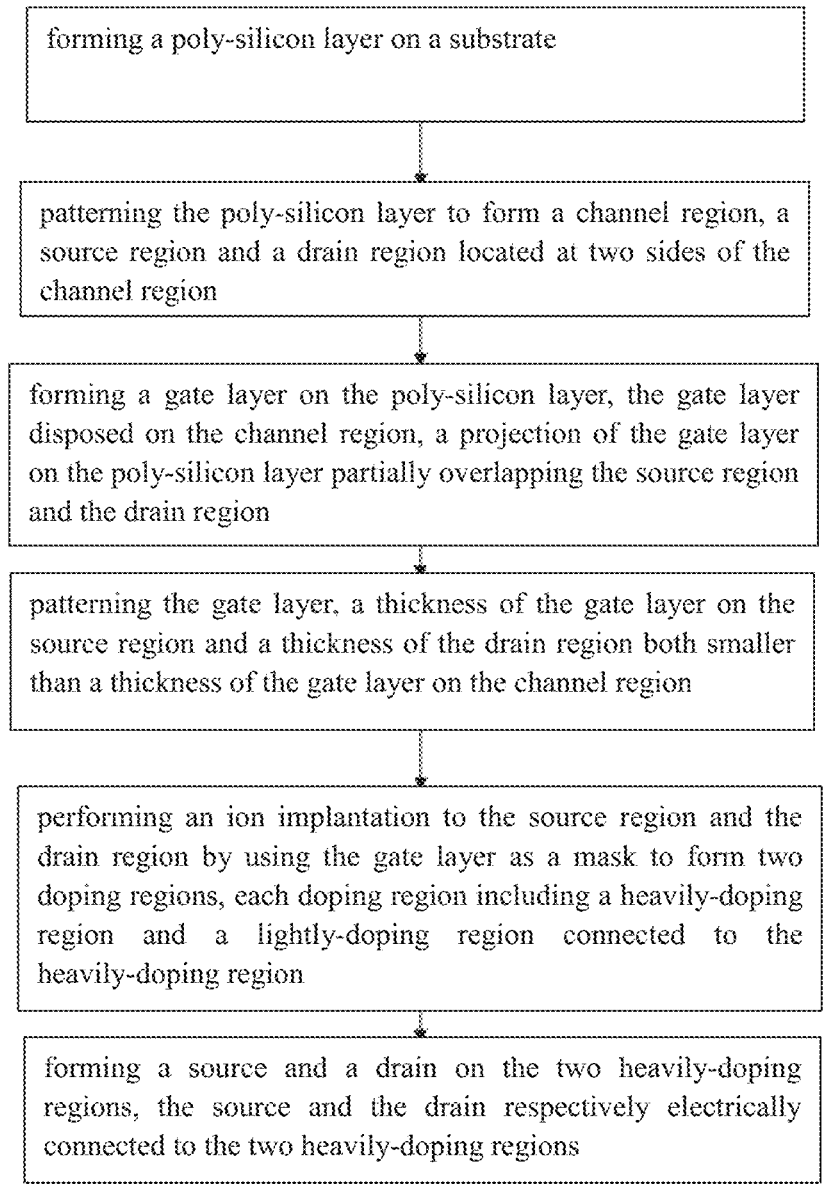
FIG. 5 is a flow chart diagram of a manufacturing method of an N-type thin film transistor according to an embodiment of the disclosure.

Referring to FIG. 5, a manufacturing method of an N-type thin film transistor provided by the embodiment includes the following steps:

forming a poly-silicon layer 1 on a substrate 5:
patterning the poly-silicon layer 1 to form a channel region 11, a source region 12 and a drain region 13 located at two sides of the channel region 11;
forming a gate layer 2 on the poly-silicon layer 1, the gate layer 2 disposed on the channel region 11, a projection of the gate layer 2 on the poly-silicon layer 1 partially overlapping the source region 12 and the drain region 13;
patterning the gate layer 2, a thickness of the gate layer 2 on the source region 12 and a thickness of the drain region 13 both smaller than a thickness of the gate layer 2 on the channel region 11;
performing an ion implantation to the source region 12 and the drain region 13 by using the gate layer 2 as a mask to form two doping regions, each doping region including a heavily-doping region 101 and a lightly-doping region 102 connected to the heavily-doping region 101;
forming a source 3 and a drain 4 on the two heavily-doping regions 101, the source 3 and the drain 4 respectively electrically connected to the two heavily-doping regions 101 (i.e. forming good ohmic contact). Wherein, the heavily-doping region 101 is also called N+ region, the lightly-doping region 102 is also called N+ region or LDD (lightly doped drain) region.

The thickness of the gate layer 2 on the lightly-doping region 102 is thinner, the accumulated charges are less when the thin film transistor applies the working voltage, the intensity of electric field is weaker, the attracted electrons are less, the resistance is larger in order to reduce the leakage current of the thin film transistor, so the property of the thin film transistor could be improved. Furthermore, the above-mentioned manufacturing method of an N-type thin film transistor has only one time of ion implantation. In the ion implantation, the gate layer 2 is used as a mask, the implanted ions of the portion of the source region 12 and the portion of the drain region 13 under the gate layer 2 are less in order to be used as the lightly-doping regions 102, the implanted ions of the portion of the source region 12 and the portion of the drain region 13 not under the gate layer 2 are more in order to be used as the heavily-doping regions 101. Therefore, the manufacturing method of an N-type thin film transistor provided by the embodiment could reduce one time of ion implantation of the lightly-doping regions 102, the process flow could be simplified and the fabrication cost could be reduced.

Moreover, the manufacturing method of an N-type thin film transistor further includes the following step before forming a gate layer 2 on the poly-silicon layer 1:

forming a gate insulating layer 7 on the poly-silicon layer 1, wherein the gate insulating layer 7 is disposed between the poly-silicon layer 1 and the gate layer 2.

The manufacturing method of an N-type thin film transistor further includes the following step before forming a poly-silicon layer 1 on a substrate 5:

forming a buffer layer 6 on the substrate 5, wherein the buffer layer 6 includes SiNx and/or SiOy, x≥1, y≥1. Selectively, depositing SiOy and SiNx continuously on the substrate 5. The buffer layer 6 could prevent the entering of the outside ions.

Forming a poly-silicon layer 1 on a substrate 5 includes the following step:

depositing an amorphous silicon layer on the buffer layer 6; and applying excimer laser crystallization to transform the amorphous silicon layer into the poly-silicon layer 1.

Furthermore, patterning the gate layer 2 includes the following step:

coating a photoresist on the gate layer 2;

exposing and developing the gate layer 2 via a halftone mask to obtain a half-reserved photoresist portion, and the half-reserved photoresist portion disposed on the source 3 and the drain 4; and partially etching an area of the gate layer 2 located at the half-reserved photoresist portion.

Figure 6:
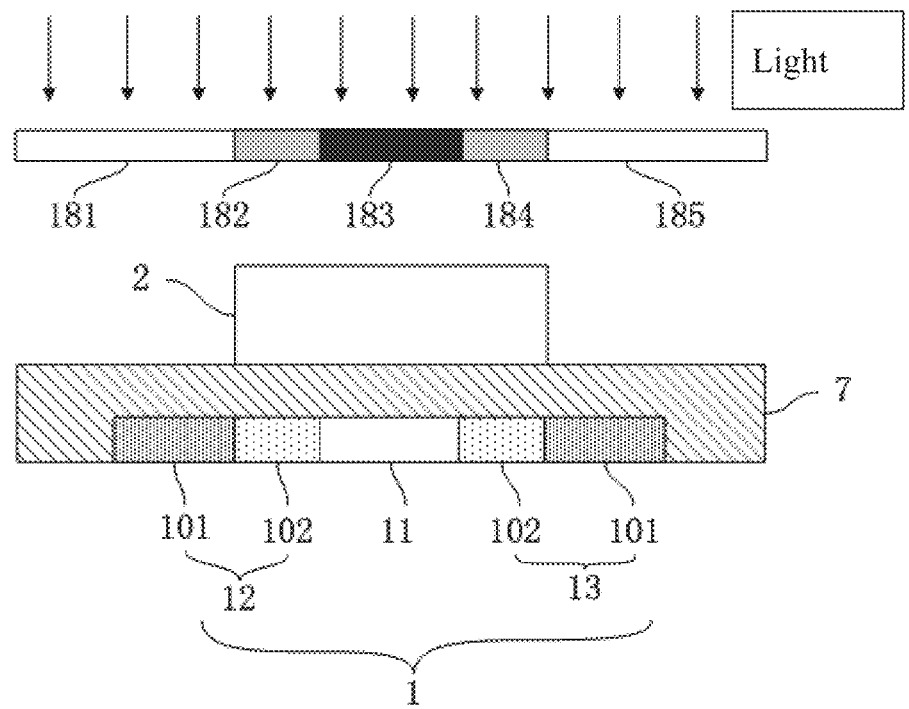
FIG. 6 is a schematic view of exposing the gate layer via a halftone mask in an N-type thin film transistor according to an embodiment of the disclosure.

Wherein, as shown in FIG. 6, the halftone mask includes a transparent area 181, a translucent area 182 and an opaque area 183. The transmittance of the translucent area 182 ranges about from 20% to 70%. The opaque area 183 is disposed on the gate layer 2 corresponding to the channel region 11 when exposing the gate layer 2 via the halftone mask, so the photoresist on the gate layer 2 on the channel region 11 is not exposed, the gate layer 2 on the channel region 11 is not etched in the etching process. Therefore, the thickness of the gate layer 2 on the channel region 11 is larger than the thickness of the gate layer 2 on the source region 12 and the thickness of the gate layer 2 on the drain region 13.

Figure 7:
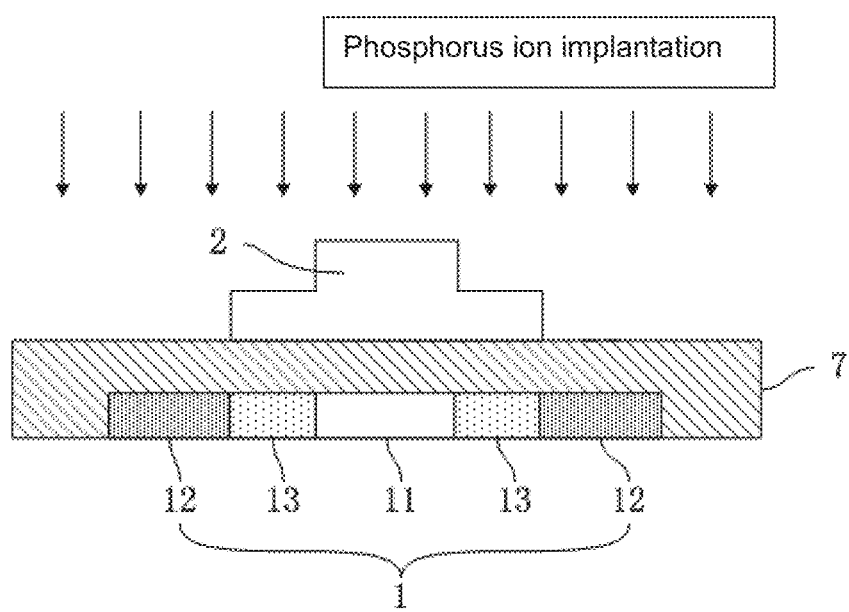
FIG. 7 is a schematic view of performing a phosphorus ion implantation to the source region and the drain region in an N-type thin film transistor according to an embodiment of the disclosure.

Moreover, performing an ion implantation to the source region 12 and the drain region 13 includes:

applying an ion implantation technology to implant phosphorus ions into the source region 12 and the drain region 13. A schematic view of performing a phosphorus ion implantation as shown in FIG. 7. Wherein the implanted ions of the heavily-doping region 101 are plenty, the resistance of the heavily-doping region 101 is small, so the source 3 and the drain 4 could have a good ohmic contact. The gate layer 2 on the lightly-doping region 102 is thinner, when the thin film transistor applies the working voltage, the intensity of electric field is weaker, the attracted electrons are less, the resistance is larger in order to reduce the leakage current of the thin film transistor, so the property of the thin film transistor could be improved.

Furthermore, forming a source 3 and a drain 4 on the two heavily-doping regions 101 includes the following steps:

forming a dielectric layer 8 on the gate insulating layer 7, and the dielectric layer 8 covering the gate insulating layer 7;

patterning the dielectric layer 8 and the gate insulating layer 7, forming two first connection holes on 14 the dielectric layer 8, forming two second connection holes 15 on the gate insulating layer 7, the two first connection holes 14 respectively face the two second connection holes 15, and the two second connection holes 15 respectively face the two heavily-doping regions 101;

depositing a metal layer on the dielectric layer 8, the metal layer electrically connected to the two heavily-doping regions 101 via the two first connection holes 14 and the two second connection holes 15; and patterning the metal layer to form the source 2 and the drain 4.

Moreover, forming a dielectric layer 8 on the gate insulating layer 7 includes:

applying plasma-enhanced chemical vapor deposition to deposit SiNx and/or SiOy to form the dielectric layer 8 on the gate insulating layer 7. The dielectric layer 8 is the ILD layer (i.e. interlayer dielectric layer). Selectively, deposit SiNx and SiOy on the gate insulating layer 7.

The manufacturing method of an N-type thin film transistor further includes the following step before patterning the dielectric layer 8 and the gate insulating layer 7:

performing rapid thermal annealing to the dielectric layer 8, wherein a temperature of rapid thermal annealing ranges from 550° C. to 600° C. and a time of rapid thermal annealing ranges from 5 minutes to 15 minutes.

Moreover, depositing a metal layer on the dielectric layer includes:

applying physical vapor deposition to sequentially deposit molybdenum, aluminum, and molybdenum on the dielectric layer 8 to form the metal layer.

A manufacturing method of an OLED display panel provided by the embodiment includes the above-mentioned manufacturing method of an N-type thin film transistor and the following steps:

forming a planarization layer 9 on the dielectric layer 8, the planarization layer 9 covering the source 3 and the drain 4;

patterning the planarization layer 9 to form a third connection hole 16 on the planarization layer 9, the third connection hole 16 disposed on the source 3 or the drain 4;

forming an anode 10 on the third connection hole 16, the anode 10 electrically connected to the source 3 or the drain 4;

depositing a pixel defining layer 11 on the planarization layer 9, the pixel defining layer 11 covering the anode 10;

patterning the pixel defining layer 11 to form a fourth connection hole 17 on the pixel defining layer 11, the fourth connection hole 17 disposed on the anode 10; and depositing an organic light emitting material 12 on the fourth connection hole 17, the organic emitting material 12 in contact with the anode 10. Wherein, the organic emitting material 12 is OLED material.

Furthermore, the third connection hole 16 is disposed on the source 3 and the drain 4.

Specifically, forming an anode 10 on the third connection hole 16 includes;

depositing an indium tin oxide (ITO) on the third connection hole 16, and patterning the indium tin oxide to form the anode 10;

wherein a material of the planarization layer 9 and a material of the pixel defining layer 11 both include polyimide.

The above-mentioned patterning each layer, such as the metal layer, the planarization layer 9, and the pixel defining layer 11, is coating a photoresist on the layer, then exposing, developing and etching to complete the patterning process.

In summary, the N-type thin film transistor and the manufacturing method thereof provided by the embodiments of the disclosure could make the thickness of the gate layer 2 on the lightly-doping region 102 is thinner, the accumulated charges are less when the thin film transistor applies the working voltage, the intensity of electric field is weaker, the attracted electrons are less, the resistance is larger in order to reduce the leakage current of the LDD region, so the property of the thin film transistor could be improved. Furthermore, the above-mentioned manufacturing method of an N-type thin film transistor has only one time of ion implantation. In the ion implantation, the gate layer 2 is used as a mask, so the manufacturing method of an N-type thin film transistor provided by the embodiment could reduce one time of ion implantation of the lightly-doping regions 102, the process flow could be simplified and the fabrication cost could be reduced.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application

What is claimed is:

1. A manufacturing method of an N-type thin film transistor, comprising the following steps:

forming a poly-silicon layer on a substrate;

patterning the poly-silicon layer to form a channel region, a source region and a drain region located at two sides of the channel region;

forming a gate layer on the poly-silicon layer, the gate layer disposed on the channel region, a projection of the gate layer on the poly-silicon layer partially overlapping the source region and the drain region;

patterning the gate layer, a thickness of the gate layer on the source region and a thickness of the drain region both smaller than a thickness of the gate layer on the channel region, wherein patterning the gate layer comprises the following step: coating a photoresist on the gate layer; exposing and developing the gate layer via a halftone mask to obtain a half-reserved photoresist portion, and the half-reserved photoresist portion disposed on the source and the drain, and partially etching an area of the gate layer located at the half-reserved photoresist portion, wherein the halftone mask includes a transparent area, a translucent area and an opaque area, a transmittance of the translucent area ranges is from 20% to 70%; the opaque area is disposed on the gate layer corresponding to the channel region when exposing the gate layer via the halftone mask;

performing an ion implantation to the source region and the drain region by using the gate layer as a mask to form two doping regions, each doping region including a heavily-doping region and a lightly-doping region connected to the heavily-doping region; and forming a source and a drain on the two heavily-doping regions, the source and the drain respectively electrically connected to the two heavily-doping regions.

2. The manufacturing method of an N-type thin film transistor according to claim 1, further comprising the following step before forming a gate layer on the poly-silicon layer:

forming a gate insulating layer on the poly-silicon layer, wherein the gate insulating layer is disposed between the poly-silicon layer and the gate layer.

3. The manufacturing method of an N-type thin film transistor according to claim 1, further comprising the following step before forming a poly-silicon layer on a substrate:

forming a buffer layer on the substrate, wherein the buffer layer includes SiNx and/or SiOy, x≥1, y≥1.

4. The manufacturing method of an N-type thin film transistor according to claim 1, wherein forming a poly-silicon layer on a substrate comprises the following step:

depositing an amorphous silicon layer on the buffer layer; and applying excimer laser crystallization to transform the amorphous silicon layer into the poly-silicon layer.

5. The manufacturing method of an N-type thin film transistor according to claim 1, wherein performing an ion implantation to the source region and the drain region includes:

applying an ion implantation technology to implant phosphorus ions into the source region and the drain region.

6. The manufacturing method of an N-type thin film transistor according to claim 2, wherein forming a source and a drain on the two heavily-doping regions comprises the following steps:

forming a dielectric layer on the gate insulating layer, and the dielectric layer covering the gate insulating layer;

patterning the dielectric layer and the gate insulating layer, forming two first connection holes on the dielectric layer, forming two second connection holes on the gate insulating layer, the two first connection holes respectively face the two second connection holes, and the two second connection holes respectively face the two heavily-doping regions;

depositing a metal layer on the dielectric layer, the metal layer electrically connected to the two heavily-doping regions via the two first connection holes and the two second connection holes; and patterning the metal layer to form the source and the drain.

7. The manufacturing method of an N-type thin film transistor according to claim 6, wherein forming a dielectric layer on the gate insulating layer includes:

applying plasma-enhanced chemical vapor deposition to deposit SiNx and/or SiOy to form the dielectric layer.

8. The manufacturing method of an N-type thin film transistor according to claim 6, further comprising the following step before patterning the dielectric layer and the gate insulating layer:

performing rapid thermal annealing to the dielectric layer, wherein a temperature of rapid thermal annealing ranges from 550° C. to 600° C. and a time of rapid thermal annealing ranges from 5 minutes to 15 minutes.

9. The manufacturing method of an N-type thin film transistor according to claim 6, wherein depositing a metal layer on the dielectric layer includes:

applying physical vapor deposition to sequentially deposit molybdenum, aluminum, and molybdenum on the dielectric layer to form the metal layer.

10. A manufacturing method of an OLED display panel, comprising the following steps:

forming a poly-silicon layer on a substrate;

patterning the poly-silicon layer to form a channel region, a source region and a drain region located at two sides of the channel region;

forming a gate insulating layer on the poly-silicon layer;

forming a gate layer on the poly-silicon layer, the gate layer disposed on the channel region, a projection of the gate layer on the poly-silicon layer partially overlapping the source region and the drain region;

patterning the gate layer, a thickness of the gate layer on the source region and a thickness of the drain region both smaller than a thickness of the gate layer on the channel region, wherein patterning the gate layer comprises the following step: coating a photoresist on the gate layer; exposing and developing the gate layer via a halftone mask to obtain a half-reserved photoresist portion, and the half-reserved photoresist portion disposed on the source and the drain, and partially etching an area of the gate layer located at the half-reserved photoresist portion, wherein the halftone mask includes a transparent area, a translucent area and an opaque area, a transmittance of the translucent area ranges is from 20% to 70%; the opaque area is disposed on the gate layer corresponding to the channel region when exposing the gate layer via the halftone mask;

performing an ion implantation to the source region and the drain region by using the gate layer as a mask to form two doping regions, each doping region including a heavily-doping region and a lightly-doping region connected to the heavily-doping region; and forming a source and a drain on the two heavily-doping regions, the source and the drain respectively electrically connected to the two heavily-doping regions;

wherein forming a source and a drain on the two heavily-doping regions comprises the following steps:

forming a dielectric layer on the gate insulating layer, and the dielectric layer covering the gate insulating layer;

wherein the manufacturing method of an OLED display panel further comprises:
forming a planarization layer on the dielectric layer, the planarization layer covering the source and the drain;
patterning the planarization layer to form a third connection hole on the planarization layer, the third connection hole disposed on the source or the drain;
forming an anode on the third connection hole, the anode electrically connected to the source or the drain;
depositing a pixel defining layer on the planarization layer, the pixel defining layer covering the anode;
patterning the pixel defining layer to form a fourth connection hole on the pixel defining layer, the fourth connection hole disposed on the anode; and
depositing an organic light emitting material on the fourth connection hole, the organic emitting material in contact with the anode.

11. The manufacturing method of an OLED display panel according to claim 10, wherein forming an anode on the third connection hole includes:
depositing an indium tin oxide, and patterning the indium tin oxide to form the anode;
wherein a material of the planarization layer and a material of the pixel defining layer both include polyimide.

12. The manufacturing method of an OLED display panel according to claim 10, further comprising the following steps before forming a poly-silicon layer on a substrate:
forming a buffer layer on the substrate, wherein the buffer layer includes SiNx and/or SiOy, x≥1, y≥1;
wherein forming a poly-silicon layer on a substrate comprises the following step:
depositing an amorphous silicon layer on the buffer layer;
applying excimer laser crystallization to transform the amorphous silicon layer into the poly-silicon layer;
wherein performing an ion implantation to the source region and the drain region includes:
applying an ion implantation technology to implant phosphorus ions into the source region and the drain region.

13. The manufacturing method of an OLED display panel according to claim 10, wherein forming a source and a drain on the two heavily-doping regions comprises the following steps:
patterning the dielectric layer and the gate insulating layer, forming two first connection holes on the dielectric layer, forming two second connection holes on the gate insulating layer, the two first connection holes respectively face the two second connection holes, and the two second connection holes respectively face the two heavily-doping regions;
depositing a metal layer on the dielectric layer, the metal layer electrically connected to the two heavily-doping regions via the two first connection holes and the two second connection holes; and
patterning the metal layer to form the source and the drain.

14. The manufacturing method of an OLED display panel according to claim 10, wherein forming a dielectric layer on the gate insulating layer includes:
applying plasma-enhanced chemical vapor deposition to deposit SiNx and/or SiOy to form the dielectric layer.

15. The manufacturing method of an OLED display panel according to claim 13, further comprises the following step before patterning the dielectric layer and the gate insulating layer:
performing rapid thermal annealing to the dielectric layer, wherein a temperature of rapid thermal annealing ranges from 550° C. to 600° C. and a time of rapid thermal annealing ranges from 5 minutes to 15 minutes; and
wherein depositing a metal layer on the dielectric layer includes:
applying physical vapor deposition to sequentially deposit molybdenum, aluminum, and molybdenum on the dielectric layer to form the metal layer.

* * * * *